(12) United States Patent
Kozono

(10) Patent No.: US 12,120,844 B2
(45) Date of Patent: Oct. 15, 2024

(54) ELECTRONICS COOLING IN AN ENVIRONMENTAL CONTROL UNIT

(71) Applicant: Robert Bosch GmbH, Stuttgart (DE)

(72) Inventor: Aya Kozono, Watertown, MA (US)

(73) Assignees: Robert Bosch LLC, Farmington Hills, MI (US); Robert Bosch GmbH, Stuttgart (DE)

( * ) Notice: Subject to any disclaimer, the term of this patent is extended or adjusted under 35 U.S.C. 154(b) by 239 days.

(21) Appl. No.: 17/898,980

(22) Filed: Aug. 30, 2022

(65) Prior Publication Data

US 2024/0074096 A1 Feb. 29, 2024

(51) Int. Cl.
*H05K 7/20* (2006.01)
*F24F 11/88* (2018.01)
*F24F 13/20* (2006.01)

(52) U.S. Cl.
CPC .......... *H05K 7/20254* (2013.01); *F24F 11/88* (2018.01); *F24F 13/20* (2013.01); *H05K 7/20154* (2013.01)

(58) Field of Classification Search
CPC .............. H05K 7/20154; H05K 7/202; H05K 7/20181; H05K 7/20254; H05K 7/20745; H05K 7/2079; H05K 1/0203; F28F 9/0212; F24F 13/20; F24F 11/30; F24F 1/0323; F24F 13/30; F24F 1/24; F24F 11/86; F24F 1/0063; F24F 12/006; G06F 1/20
USPC ........................................................ 361/695
See application file for complete search history.

(56) References Cited

U.S. PATENT DOCUMENTS

| | | | | |
|---|---|---|---|---|
| 3,742,725 | A * | 7/1973 | Berger | F24F 1/035 62/298 |
| 5,983,888 | A * | 11/1999 | Anselmino | F04D 29/664 454/67 |
| 7,263,850 | B2 * | 9/2007 | Eom | F24F 1/005 62/286 |
| 9,516,786 | B2 | 12/2016 | Lan et al. | |
| 10,634,368 | B2 | 4/2020 | Kim et al. | |
| 2012/0312046 | A1 | 12/2012 | Kim et al. | |
| 2015/0059389 | A1 | 3/2015 | Liu et al. | |
| 2017/0167737 | A1 * | 6/2017 | Kil | F24F 1/0323 |
| 2017/0202106 | A1 * | 7/2017 | Bhutta | H01J 37/3299 |
| 2021/0396425 | A1 * | 12/2021 | Davtyan | F24F 1/029 |

* cited by examiner

Primary Examiner — Mandeep S Buttar
(74) Attorney, Agent, or Firm — Kelly McGlashen

(57) ABSTRACT

An environmental control unit (ECU) such as a heat pump includes a housing having a divider panel. The divider panel is surrounded by a sidewall and segregates an interior space of the housing into an air-handling portion and a condensing portion. The ECU includes a blower disposed in the air-handling portion, a heat exchanger disposed in the air-handling portion, a compressor disposed in the condensing portion and a fluid circuit including a refrigerant line that connects the heat exchanger to the compressor. In addition, the ECU includes an electronics box that is mounted on the divider panel and houses a control board, the electronics box being provided with two independent modes of cooling. The first mode includes convective cooling via air flow generated by the blower, and the second mode includes conductive cooling via a cooling plate that is cooled by the refrigerant line.

10 Claims, 5 Drawing Sheets

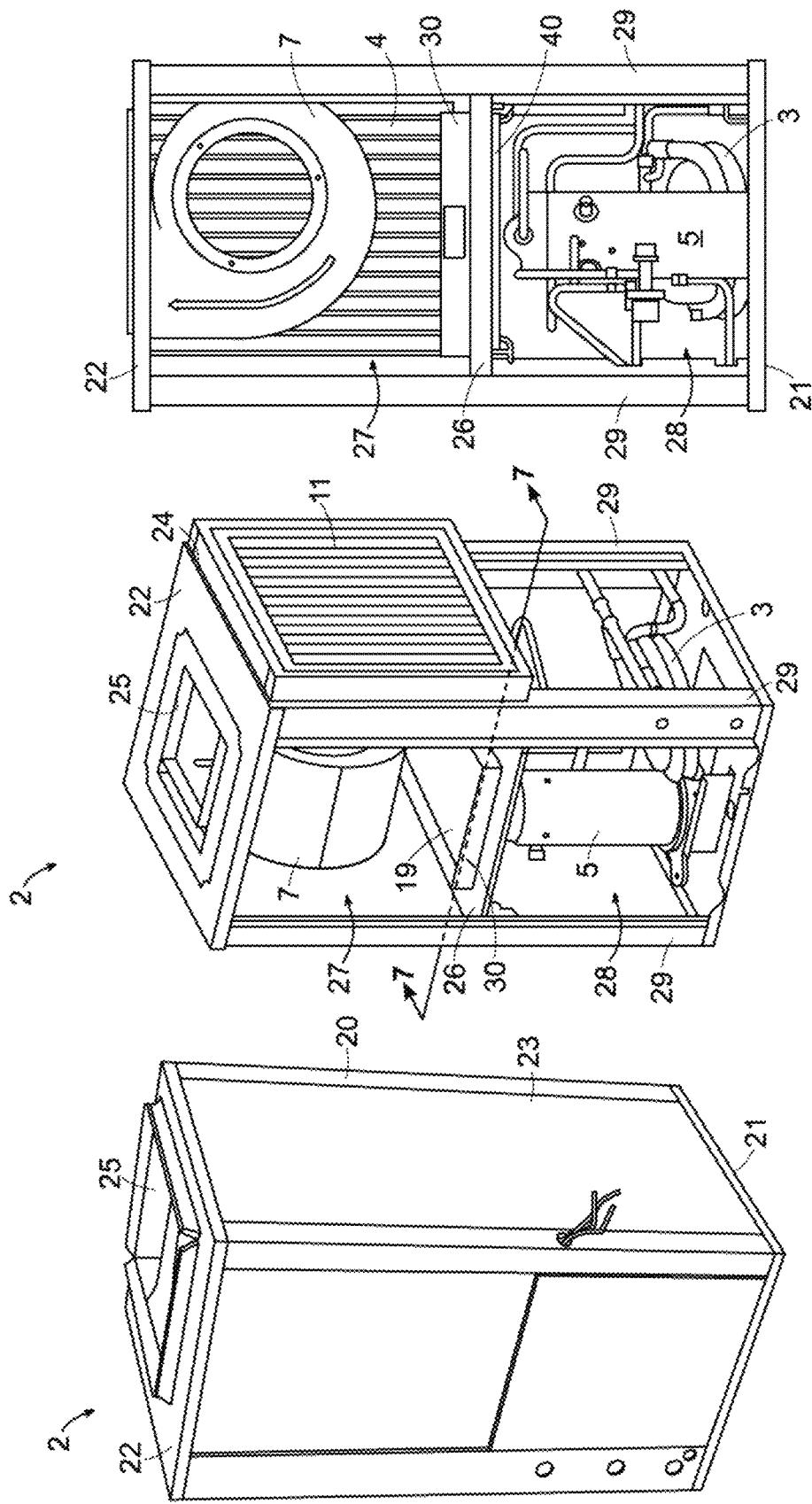

ELECTRONICS COOLING IN AN ENVIRONMENTAL CONTROL UNIT

BACKGROUND

Environmental control units such as HVAC or heat pump units are used in many heating and cooling applications to control the environment within a closed space. Some conventional heat pumps, for example, include a condensing heat exchanger and an evaporating heat exchanger disposed in a cabinet along with a compressor and a blower that is configured to draw air through the heat exchangers. Heating or cooling equipment such as an HVAC or heat pump units employing a compressor and/or blower are controlled by a controller and other ancillary electronic components that disposed in the cabinet. The controller and electronics of the environmental control unit require cooling to obtain reliable and efficient performance. Although some environmental control units employ the air drawn by the blower to cool the controller and electronics, it is desirable to improved cooling of the controller and electronics in order to improve unit performance.

SUMMARY

A heating and/or cooling device such as an HVAC unit or heat pump unit may be housed in a cabinet that is segregated into a blower region and a compressor region separated from one another by a divider panel. The unit includes a controller and ancillary electronics that are mounted on a printed circuit board (PCB). The PCB may be disposed in a container or housing referred to as an "electronics box" or alternatively as an "e-box." The e-box is disposed in the blower region and is mounted on the divider panel. A side of the e-box facing the blower may be open so that the PCB including the controller is exposed to air flow drawn through the blower region by the blower. The unit also includes a cooling plate that includes a coolant line. The coolant line is in fluid communication with the refrigerant line of the unit. The cooling plate is disposed in the compressor region and is mounted on the divider panel in such a way that heat conduction can occur between the cooling plate and the PCB. By this configuration, the PCB and the associated electronics are cooled on the blower side by airflow from the blower and on the compressor side by the cooling plate. This configuration provides improved cooling of the controller and other unit electronics as compared to some units having only blower-drawn cooling.

In some aspects, an environmental control unit includes a housing. The housing includes a first end, a second end, a sidewall that extends between the first end and the second end, and a divider panel that is surrounded by the sidewall and segregates an interior space of the housing into an air-handling portion and a condensing portion. The environmental control unit includes a blower and heat exchanger disposed in the air-handling portion and a compressor disposed in the condensing portion. The environmental control unit includes a fluid circuit including a refrigerant line that connects the heat exchanger to the compressor; and an electronics box that is mounted on the divider panel and houses a control board. The electronics box is provided with two independent modes of cooling.

In some embodiments, the electronics box includes a first side that faces the blower and a second side that faces the compressor. The first side is cooled by airflow from the blower and the second side is cooled by a coolant line that is connected to the refrigerant line.

In some embodiments, a first mode of the two independent modes of cooling includes convective cooling via air flow generated by the blower, and a second mode of the two independent modes of cooling includes conductive cooling via a cooling plate that is cooled by the refrigerant line.

In some embodiments, the cooling plate is in direct contact with the divider panel at a location that is aligned with the control board.

In some embodiments, the cooling plate is physically connected to the control board.

In some embodiments, one mode of the two independent modes of cooling includes conductive cooling via a cooling plate. The cooling plate includes a first cooling plate surface and a second cooling plate surface that is opposite the first cooling plate surface. The second cooling plate surface faces the blower and directly contacts the divider panel. The cooling plate includes an internal passageway that defines a coolant line that is disposed between the first cooling plate surface and the second cooling plate surface. The coolant line is in fluid communication with the refrigerant line.

In some embodiments, one mode of the two independent modes of cooling includes conductive cooling via a cooling plate. The cooling plate includes a first cooling plate surface and a second cooling plate surface that is opposite the first cooling plate surface and faces the blower. The cooling plate includes an internal passageway that defines a coolant line that is disposed between the first cooling plate surface and the second cooling plate surface. The coolant line is in fluid communication with the refrigerant line. In addition, the electronics box includes a side that faces the divider panel. The side has a box through opening that is aligned with the control board. The electronics box includes a thermally conductive plate that overlies the through opening. The thermally conductive plate is disposed between, and in direct contact with, both the control board and the side of the electronics box. The first cooling plate surface directly contacts the thermally conductive plate via the through opening.

In some embodiments, the air handling portion overlies the condensing portion.

In some embodiments, the control board comprises a printed circuit board and a controller that is mounted on the printed circuit board.

In some embodiments, one mode of the two independent modes of cooling includes conductive cooling via a cooling plate. The cooling plate includes a first cooling plate surface that faces the blower, a second cooling plate surface that is opposite the first cooling plate surface and an internal passageway that defines a coolant line that is disposed between the first cooling plate surface and the second cooling plate surface. The coolant line is in fluid communication with the refrigerant line and extends in a serpentine path.

In some embodiments, one mode of the two independent modes of cooling includes conductive cooling via a cooling plate. The cooling plate includes a first cooling plate surface that faces the blower, a second cooling plate surface that is opposite the first cooling plate surface and an internal passageway that defines a coolant line that is disposed between the first cooling plate surface and the second cooling plate surface. The coolant line is in fluid communication with the refrigerant line. In addition, the internal passageway includes a plurality of internal passages that are supplied by a manifold that is connected to the refrigerant line.

It is understood that the invention is not limited in its application to the details of construction and the arrangement of components set forth in the following description or illustrated in the following drawings. The invention is capable of other embodiments and of being practiced or of being carried out in various ways.

BRIEF DESCRIPTION OF THE FIGURES

In FIG. 1, arrows having solid lines represent cold fluid and arrows having broken lines represent hot fluid. In addition, narrow arrows represent refrigerant and wide arrows represent air or water as appropriate.

In FIG. 2, arrows having solid lines represent cold fluid and arrows having broken lines represent hot fluid. In addition, narrow arrows represent refrigerant and wide arrows represent air or water as appropriate.

FIG. 3 is a first side perspective view of the heat pump of FIG. 1.

FIG. 4 is a second side perspective view of the heat pump of FIG. 1 shown with housing sidewalls omitted to show the arrangement of some of the main components of the heat pump within the heat pump housing.

FIG. 5 is a side view of the heat pump of FIG. 4.

DETAILED DESCRIPTION

Figure 1:
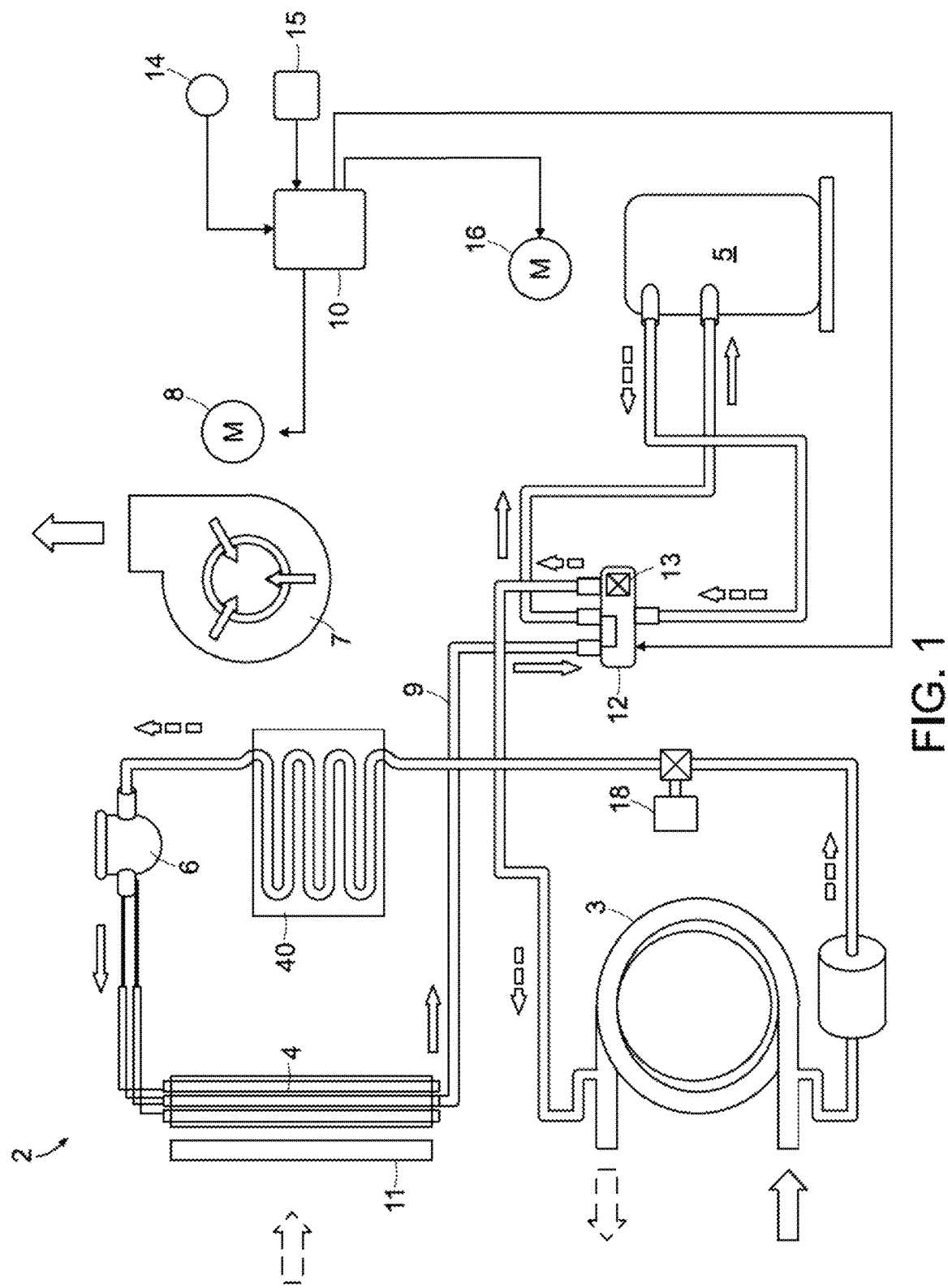
FIG. 1 is a schematic diagram of a water source heat pump, including arrows that represent fluid flow during a cooling operation of the heat pump.
Figure 2:
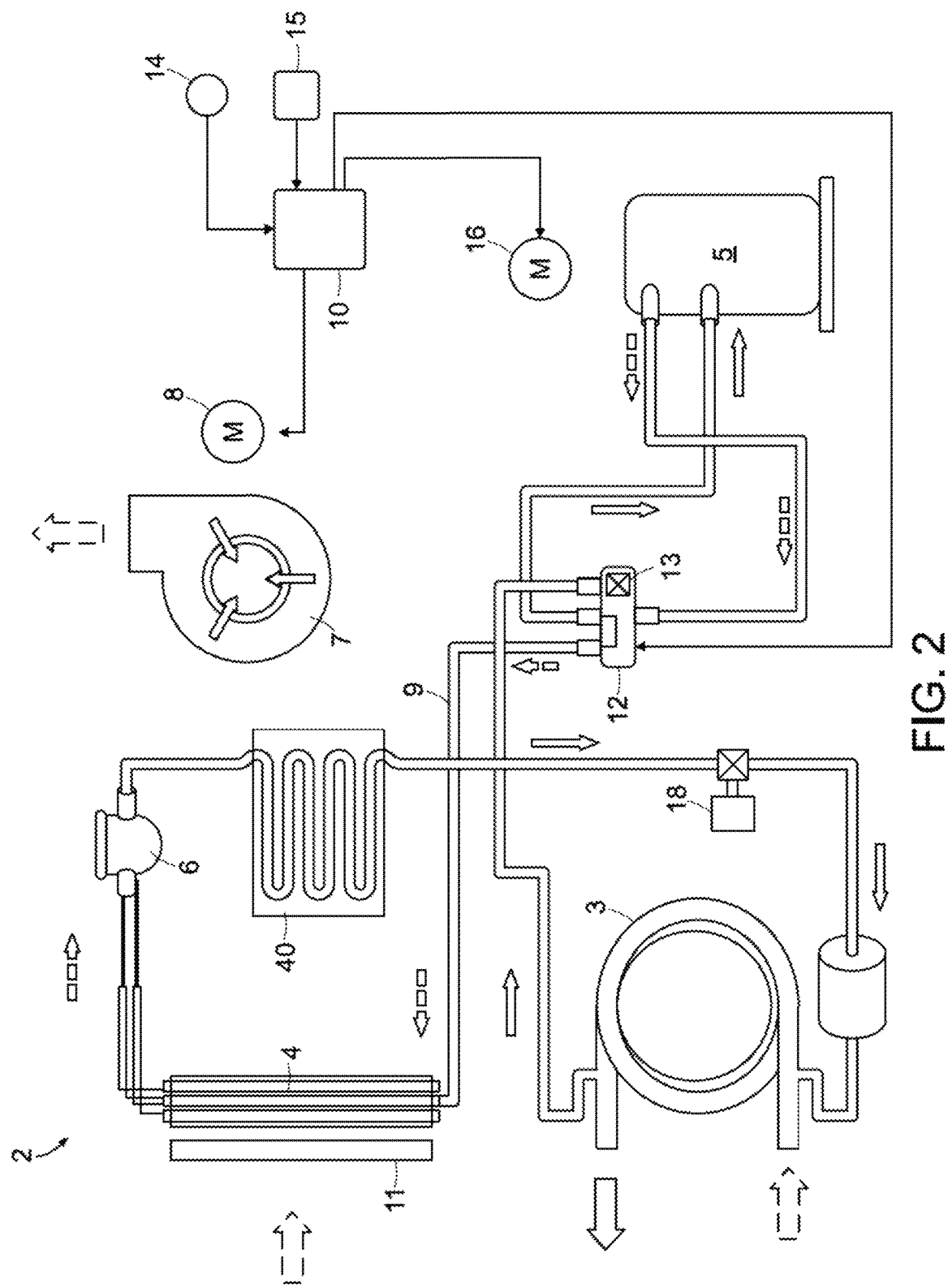
FIG. 2 is a schematic diagram of the water source heat pump of FIG. 1, including arrows that represent fluid flow during a heating operation of the heat pump.

Referring to FIGS. 1-5, an environmental control unit such as a water source heat pump 2 may be used to control the environment within a closed space such as the interior of a building by providing heating and/or cooling functions. The heat pump 2 is an assembly of several components, including heat exchangers 3, 4, a compressor 5, expansion valves 6, 18 and a blower 7. The heat pump 2 may include other ancillary components such as an air filter 11 and a controller 10 that is configured to control operation of the heat pump 2 based on input from a user via a user input device such as a thermostat 15, thermal sensors 14 or other sources. In addition, the heat pump 2 may include noise reduction features (not shown) that reduce the amount of noise generated by the heat pump 2 during operation. The heat pump 2 includes two independent modes which act simultaneously to cool the controller and other unit electronics. In particular, the PCB is arranged within a housing 20 of the heat pump 2 in such a way that the PCB and its associated electronics are exposed to a cooling air flow while also being cooled by a cooling plate 40, as discussed in detail below.

The heat pump 2 is a water source heat pump that includes a fluid circuit in the form of a reversible cooling/heating loop 9. In the illustrated embodiment, the fluid that passes through the loop 9 is a refrigerant, although it is not limited thereto. The refrigerant may be any fluid that absorbs and extracts heat.

The reversible cooling/heating loop 9 permits the heat pump 2 to be switchable between heating and cooling functions. To this end, the heat pump 2 includes a water-to-refrigerant heat exchanger 3 and an air-to-refrigerant heat exchanger 4 that may function either as an evaporator or a condenser depending on the heat pump operation mode. For example, when heat pump 2 is operating in cooling mode (FIG. 1), the water-to-refrigerant heat exchanger 3 functions as a condenser, releasing heat to the water, while the air-to-refrigerant heat exchanger 4 functions as an evaporator, absorbing heat from the ambient air. When heat pump 2 is operating in heating mode (FIG. 2), the water-to-refrigerant heat exchanger 3 functions as an evaporator, absorbing heat from the water, while the air-to-refrigerant heat exchanger 4 functions as a condenser, releasing heat to the ambient air. The heat pump 2 will be described herein as though configured to perform a cooling function within the building 1. In addition, the heat pump 2 includes a reversing valve 12 that is positioned in the loop 9 between the heat exchangers 3, 4 to control the direction of refrigerant flow and thereby to switch the heat pump 2 between heating mode and cooling mode. In the illustrated example, the reversing valve 12 is controlled by the controller 10 via, for example, a solenoid 13.

The air-to-refrigerant heat exchanger 4 may be an air coil unit having fluid circuits comprised of serially-connected thermally conductive tubes (not shown). The air-to-refrigerant heat exchanger 4 is mounted in an air inlet 24 provided on one side of the heat pump housing 20. An air filter 11 overlies the air inlet 24. Air is drawn into the heat pump housing 20 through the air filter 11 and the air coil unit of the heat exchanger 4 via a blower 7 that is also disposed in the heat pump housing 20 adjacent to the heat exchanger 4. The blower 7 is driven by blower motor 8 and discharges air from the heat pump housing 20 via an air outlet 25.

The water-to-refrigerant heat exchanger 3 may be a dual, concentric lumen tube in which the inner lumen provides a refrigerant passageway (not shown), and the outer lumen surrounds (or "jackets") the inner lumen and provides a water passageway (not shown). Water is supplied to the outer lumen via hose connectors provided in the heat pump housing 20. The tube is coiled about a coil axis 39 to minimize space requirements.

The compressor 5 may be any suitable compressor such as a screw compressor, reciprocating compressor, rotary compressor, swing link compressor, scroll compressor, or turbine compressor.

The heat pump 2 includes a thermal expansion valve (TXV) 6 that is positioned in the loop 9 between the water source heat exchanger 3 and the air source heat exchanger 4. The TXV 6 is configured to decrease the pressure and temperature of the refrigerant before it enters the evaporator. The TXV 6 may also regulate the refrigerant flow entering the evaporator so that the amount of refrigerant entering the evaporator equals, or approximately equals, the amount of refrigerant exiting the evaporator.

In addition to the TXV 6, the heat pump 2 may also include an electronic expansion valve (EEV) 18 that is positioned in the loop 9 between the water source heat exchanger 3 and the TXV 6. The EEV 18 provides a more precise control of the refrigerant flow than the TXV 6, ensuring that when in heating mode the PCB 19 is cooled appropriately.

During a cooling operation, the refrigerant enters the air-to-refrigerant heat exchanger 4 (e.g., the evaporator) as a low temperature and pressure liquid. Some vapor refrigerant also may be present as a result of the expansion process that occurs in the TXV 6. The refrigerant flows through the air-to-refrigerant heat exchanger 4 and absorbs heat from the air, changing the refrigerant into a vapor. After exiting the evaporator, the refrigerant passes through reversing valve 12 and into the compressor 5. The compressor 5 decreases the volume of the refrigerant vapor, thereby, increasing the temperature and pressure of the vapor. After exiting from the compressor 5, the increased temperature and pressure vapor refrigerant flows into the water-to-refrigerant heat exchanger 3 (e.g., the condenser). In the water-to-refrigerant heat exchanger 3, the refrigerant vapor flows into the water coil while water is cycling therethrough. The heat from the refrigerant is transferred to the water causing the refrigerant to condense into a liquid. After exiting the water-to-refrigerant heat exchanger 3, the liquid refrigerant flows through the TXV 6 and returns to the air-to-refrigerant heat exchanger 4 (e.g., the evaporator) as a low temperature and pressure liquid, where the cooling process begins again.

A motor 16 drives the compressor 5 and circulates refrigerant through the loop 9. The operation of the compressor motor 16 is controlled by the controller 10. The controller 10 receives information from the input device 15 and a temperature sensor 14 and uses the information to control the operation of heat pump 2 in both cooling mode and heating mode. In addition, the controller 10 uses information received from the input device 15 to switch the heat pump 2 between the heating mode and the cooling mode. For example, if the input device 15 is set to the cooling mode, the controller 10 will send a signal to the solenoid 13 to place reversing valve 12 in an air conditioning position. Consequently, the refrigerant will flow through reversible loop 9 as described above. If the input device 15 is set to the heating mode, the controller 10 will send a signal to the solenoid 13 to place the reversing valve 12 in a heating position. Consequently, the refrigerant will flow through the reversible loop 9 as follows: the refrigerant exits compressor 5, is condensed in the air-to-refrigerant heat exchanger 4, is expanded in the TXV 6, and is evaporated in the water-to-refrigerant heat exchanger 3.

The controller 10 includes a processor or microprocessor (not shown) that is configured to execute hardware or software control algorithms to monitor and regulate heat pump 2. In some exemplary embodiments, the controller 10 may include an analog to digital (A/D) converter, a non-volatile memory, and other ancillary electronic components that are supported on a PCB 19. As used herein, the term "control board 35" refers to the PCB 19 in combination with the controller 10 and associated electronic components. The control board 35 may also include other ancillary electronic devices required for operation of the heating unit 2, including an inverter, wireless communication devices, etcetera.

Figure 6:
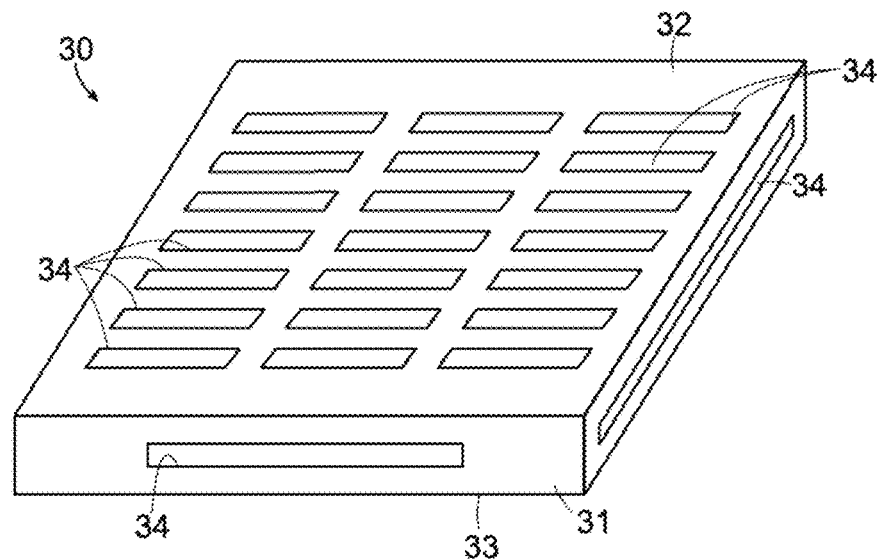
FIG. 6 is a perspective view of the e box.
Figure 7:
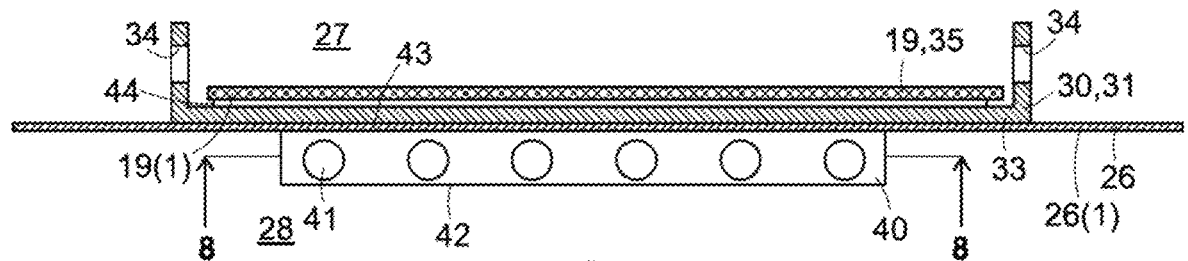
FIG. 7 is a cross-sectional view of a portion of the heat pump of FIG. 1 as seen along line 7-7 of FIG. 4 illustrating an e-box mounted on one side of the divider panel and the cooling plate mounted on the other side of the divider panel.
Figure 8:
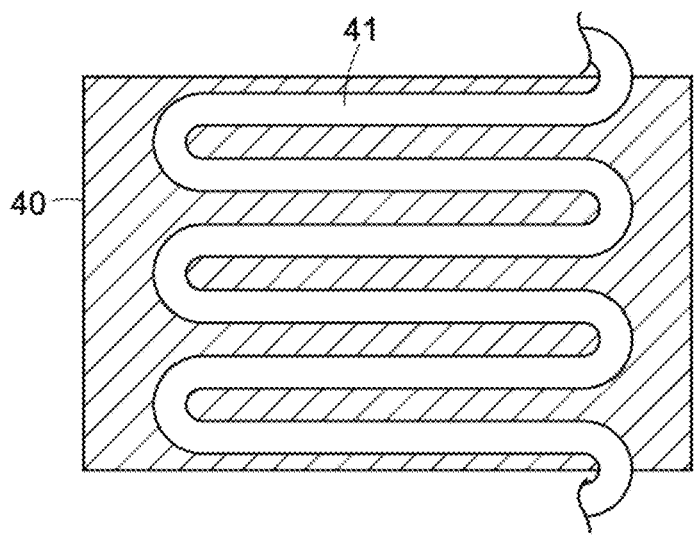
FIG. 8 is a cross-sectional view of the cooling plate as seen along line 8-8 of FIG. 7.

Referring to FIGS. 6-8, the control board 35 may be housed in a protective electronics box 30, referred to hereafter as an "e-box." The e-box 30 includes a container portion 31 and a lid 32. The container portion 31 includes a bottom 33 and a sidewall 34 that is perpendicular to, and surrounds a periphery of, the bottom 33. The lid 32 closes an open end of the container portion 31. In some embodiments, the e-box 30 may include perforations 34 that permit flow of air between the environment and the e-box interior. The e-box 30 has the shape of low-profile rectangular prism in that the e-box 30 has a height that is much shorter that its length and width, where the height corresponds to a dimension of the sidewall 34 in a direction perpendicular to the bottom 33. The e-box 30 is disposed in the heat pump housing 20 so as to be exposed to air flow from the blower 7, as discussed in detail below.

In some embodiments, the e-box 30 completely encloses the control board 35 and includes the perforations 34 that permit air flow therethrough. However, in other embodiments, a blower-facing side of the e-box 30, which corresponds to the lid 32 in the illustrated embodiment, may be at least partially omitted (as shown in FIGS. 4 and 7) whereby the control board 35 is exposed to air flow generated by the blower 7.

In the illustrated embodiment, the control board 35 rests on a heat sink 44 that is disposed in the e-box 30. The heat sink 44 is a flat, thermally conductive plate that rests on the bottom 33 of the e-box 30. In the illustrated embodiment, the heat sink 44 is a copper plate, but is not limited to this material. The PCB 19 overlies the e-box bottom 33 with the heat sink 44 interposed between the PCB 19 and the e-box 18. The PCB 19, the heat sink 44 and the bottom 33 of the e-box 30 are parallel to each other. In this configuration, the broad, divider panel-facing surface 19(1) of the PCB 19 directly contacts the heat sink 44 whereby thermal conduction occurs from the PCB 19 to the heat sink 44. In addition, the e-box 30 is formed of a thermally conductive material. Since the heat sink 44 is in direct contact with the e-box bottom 33, thermal conduction occurs from the heat sink 44 to the e-box bottom 33.

Referring again to FIGS. 3-5, the heat pump housing 20 includes a closed first end or bottom 21 corresponding to an end of the heat pump 2 that rests on a support surface such as the ground, a floor or a shelf. The heat pump housing 20 includes a closed second end or top 22 that is opposed to the first end 21. The first and second ends 21, 22 may be supported on an interior frame that includes four vertically-extending corner posts 29. A sidewall 23 extends between the first and second ends 21, 22 and surrounds the corner posts 29.

In addition, the heat pump housing 20 includes a divider panel 26 that segregates an interior space of the housing 20 into an air handler portion 27 and a condensing portion 28, where the condensing portion 28 underlies the air handler portion 27. The divider panel 26 is a thin, rigid plate that is parallel to the housing first end 21 and is fixed to the sidewall 23 at a location below the air inlet 24.

The air inlet 24 is provided in the sidewall 23 at a location that is closer to the second end 22 than the first end 21 so as to communicate with the air handler portion 27. The air outlet 25 is provided in the second end 22 and permits air to exit the housing 20. The air-to-refrigerant heat exchanger 4 is disposed in the air handler portion 27 at a location corresponding to the air inlet 24, and the blower 7 is disposed adjacent to the air-to-refrigerant heat exchanger 4 and is connected to the air outlet 25. The blower 7 may be, for example, a squirrel cage blower. The blower 7 draws air into the heat pump housing 20. Air drawn into the heat pump housing 20 via the air inlet 24 passes through the air filter 11 and then the coils of the heat exchanger 4. Air conditioned by the air-to-refrigerant heat exchanger 4 is drawn into an inlet of the blower 7, and then exhausted from the housing air outlet 25.

In the illustrated embodiment, the compressor 5 is disposed in the condensing portion 28 of the heat pump housing 20 (e.g., at a location that is below the air-to-refrigerant heat exchanger 4 and the blower 7), and rests on an inner surface of the heat pump housing first end 21.

The water-to-refrigerant heat exchanger 3 may be supported on the housing first end 21 in an angled orientation via a support bracket 38. The support bracket 38 supports the water-to-refrigerant heat exchanger 3 in such a way that the coil axis 39 is acutely angled relative to the housing first end 21. For example, the support bracket 38 may be configured to orient the coils at a 20 degree angle relative to the housing first end 21. Although in the illustrated embodiment, the water-to-refrigerant heat exchanger 3 is disposed side-by-side with the compressor 5, in other embodiments the compressor 5 may be encircled by the water-to-refrigerant heat exchanger 3.

In the heat pump 2, the e-box 30 is disposed in the air-handling portion 27 of the housing 20 such that the e-box bottom 33 is supported on an upper side of the divider panel 26 (e.g., on the air handler section-facing side of the divider panel 26). In some embodiments, the e-box 30 is detachably fixed to the divider panel 26. During installation, maintenance or service of the heat pump 2, the e-box 30 may be detached from the divider panel 26 to permit easy access to the control board 35. After completion of the installation and under normal operation, the e-box 30 should remain mounted on the divider panel 26.

Referring again to FIGS. 1, 7 and 8, the heat pump 2 includes a cooling plate 40 that provides cooling of the control board 35. The cooling plate 40 is thermally conductive plate that is disposed in the condensing portion 28 of the housing 20. The cooling plate 40 includes an internal passageway that defines a coolant line 41. The coolant line 41 is in fluid communication with, and is supplied with refrigerant from, the reversible loop 9. For example, in the illustrated embodiment, the coolant line 41 is disposed in the loop 9 at a location between the water-to-refrigerant heat exchanger 3 and the TXV 6, and more particularly between the EEV 18 and the TXV 6.

The cooling plate 40 includes a first cooling plate surface 42 that faces the housing first end 21 and a second cooling plate surface 43 that is opposite the first cooling plate surface and faces the divider panel 26. The coolant line 41 is disposed between the first and second cooling plate surfaces 42, 43 and forms a serpentine shape to maximize contact area between internal surfaces of the cooling plate 40 and refrigerant passing through the coolant line 41.

The cooling plate 40 is fixed to the first end-facing surface 26(1) of the divider panel 26 such that the second cooling plate surface 43 directly contacts the divider panel 26 at a location that is vertically aligned with the control board 35. The cooling plate 40 may be secured to the divider panel 26 via fasteners (not shown) or other conventional techniques. In this embodiment, the cooling plate 40 is physically connected to the control board 35 via the divider panel 26, the e-box bottom 33 and the heat sink 44.

By the above-described configuration, the e-box 30 is provided with two independent modes of cooling. In particular, the first mode of the two independent modes of cooling includes convective cooling via air flow generated by the blower 7, and the second mode of the two independent modes of cooling includes conductive cooling via a cooling plate 40 that contacts the e-box 30 and is cooled by the refrigerant line (e.g., reversible loop 9). This configuration provides improved cooling of the control board 35 and other unit electronics as compared to some units having only blower-drawn cooling.

Figure 9:
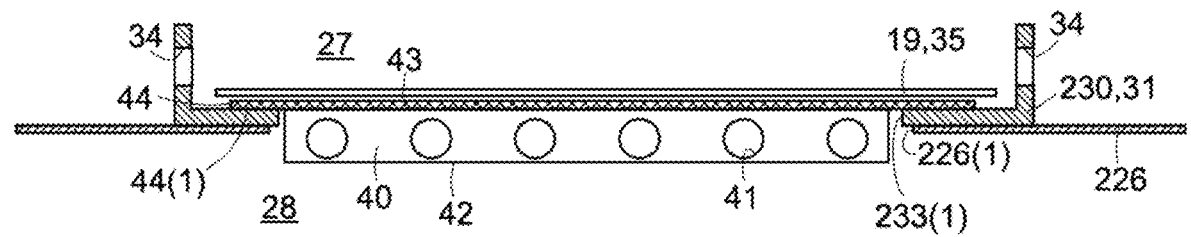
FIG. 9 is a cross-sectional view of a portion of an alternative embodiment heat pump illustrating an e-box mounted on one side of the divider panel and a cooling plate mounted on the control board via the heat sink.

Referring to FIG. 9, alternative embodiment heat pump includes an e-box 230 disposed in the air handler portion 27 and a cooling plate 40 disposed in the condensing portion 28, in a manner similar to that of the embodiment illustrated in FIGS. 1-5. However, in the alternative embodiment heat pump, the cooling plate 40 is in direct physical contact with the heat sink 44. To that end, the divider panel 226 includes a panel through opening 226(1). In addition, the e-box 230 includes a box through opening 233(1) provided in the e-box bottom 233 and aligned with the panel through opening 226(1). The panel through opening 226(1) is shaped and dimensioned to permit the cooling plate 40 to reside therein, while permitting the divider panel 226 to support the e-box 230. In addition, the box through opening 233(1) is shaped and dimensioned to permit the cooling plate 40 to reside therein, while having a profile that is smaller than that of the heat sink 44. By this configuration, the heat sink 44 extends over the respective through openings 226(1), 233(1) and retains and supports the control board 35 within the e-box 230.

The cooling plate 40 is fixed to the first end-facing surface 44(1) of the heat sink 44 such that the second cooling plate surface 43 directly contacts the heat sink 44 at a location that is aligned with the control board 35. The cooling plate 40 may be secured to the heat sink 44 via fasteners (not shown) or other conventional techniques. In this embodiment, the cooling plate 40 is physically connected to the control board 35 via the heat sink 44. In other embodiments, the heat sink 44 may be omitted, whereby the cooling plate 40 may be in direct contact with the control board 35.

Like the previous embodiment, the e-box illustrated in FIG. 9 is provided with two independent modes of cooling. In particular, the first mode of the two independent modes of cooling includes convective cooling via air flow generated by the blower 7, and the second mode of the two independent modes of cooling includes conductive cooling via a cooling plate 40 that contacts the heat sink 44 and is cooled by the refrigerant line (e.g., reversible loop 9). This configuration provides improved cooling of the control board 35 and other unit electronics as compared to some units having only blower-drawn cooling.

Figure 10:
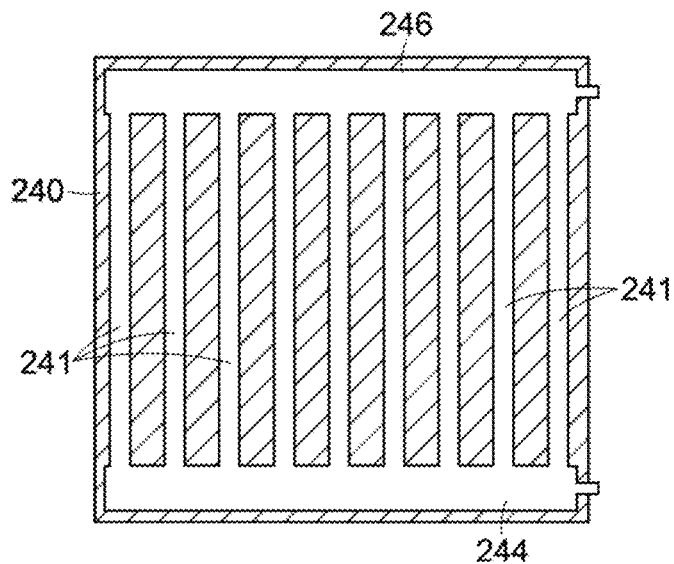
FIG. 10 is a cross-sectional view of an alternative embodiment cooling plate.

Referring to FIG. 10, it is understood that the coolant line 41 of the cooling plate is not limited to a single line having a serpentine arrangement. For example, in the alternative embodiment cooling plate 240 illustrated in FIG. 10, the internal passageway comprises a plurality of coolant lines 241 that extend between an inlet manifold 244 and an outlet manifold 246. The inlet and outlet manifolds 244, 246 are in fluid communication with the loop 9, as discussed above.

In the illustrated embodiment, the e-box 30 is detachably secured to the divider panel 26. However, the e-box 30 is not limited to this configuration. For example, in some embodiments, the e-box 30 may be configured to translate relative to the housing 20 via a slide mechanism (not shown) in a direction that is parallel to the divider panel 26. The slide mechanism permits the e-box 30 to move between a retracted position in which the e-box 30 resides within the air handling portion of the housing 20, and an extended position in which the e-box 30 resides outside the housing 20. In some embodiments, the slide mechanism permits extension with respect to both of opposed sides of the housing 20.

Although in the illustrated embodiment, the condensing portion 28 underlies the air handler portion 27, the heat pump 2 is not limited to this configuration. For example, in other embodiments, the air handler portion 27 and the condensing portion may be arranged side-by-side along a horizontal plane.

Selective illustrative embodiments of the heat pump including the electronics cooling device are described above in some detail. It should be understood that only structures considered necessary for clarifying the heat pump and the cooling device have been described herein. Other conventional structures, and those of ancillary and auxiliary components of the heat pump, the electronics and the cooling device are assumed to be known and understood by those skilled in the art. Moreover, while a working example of the heat pump including the electronics cooling device has been described above, the heat pump and/or electronics cooling device are not limited to the working example described above, but various design alterations may be carried out without departing from the device as set forth in the claims.

What is claimed is:

1. An environmental control unit comprises: a housing that includes a first end, a second end, a sidewall that extends between the first end and the second end, and a divider panel that is surrounded by the sidewall and segregates an interior space of the housing into an air-handling portion and a condensing portion; a blower disposed in the air-handling portion; a heat exchanger disposed in the air-handling portion; a compressor disposed in the condensing portion; a fluid circuit including a refrigerant line that connects the heat exchanger to the compressor; and an electronics box that is mounted on the divider panel and houses a control board, the electronics box being provided with two independent modes of cooling; wherein the electronics box includes a first side that faces the blower and a second side that faces the compressor, and the first side is cooled by airflow from the blower and the second side is cooled by a coolant line that is connected to the refrigerant line.

2. The environmental control unit of claim 1, wherein
   a first mode of the two independent modes of cooling includes convective cooling via air flow generated by the blower, and
   a second mode of the two independent modes of cooling includes conductive cooling via a cooling plate that is cooled by the refrigerant line.

3. The environmental control unit of claim 2, wherein the cooling plate is in direct contact with the divider panel at a location that is aligned with the control board.

4. The environmental control unit of claim 2, wherein the cooling plate is physically connected to the control board.

5. The environmental control unit of claim 1, wherein one mode of the two independent modes of cooling includes conductive cooling via a cooling plate, the cooling plate comprising a first cooling plate surface, a second cooling plate surface that is opposite the first cooling plate surface and faces the blower, the second cooling plate surface directly contacting the divider panel, and an internal passageway that defines the coolant line that is disposed between the first cooling plate surface and the second cooling plate surface, the coolant line being in fluid communication with the refrigerant line.

6. The environmental control unit of claim 1, wherein one mode of the two independent modes of cooling includes conductive cooling via a cooling plate, the cooling plate comprising: a first cooling plate surface, a second cooling plate surface that is opposite the first cooling plate surface and faces the blower, and an internal passageway that defines the coolant line that is disposed between the first cooling plate surface and the second cooling plate surface, the coolant line being in fluid communication with the refrigerant line, and the electronics box comprises: a side that faces the divider panel, the side having a box through opening that is aligned with the control board, and a thermally conductive plate that overlies the through opening, the thermally conductive plate disposed between, and in direct contact with, both the control board and the side of the electronics box, and wherein the first cooling plate surface directly contacts the thermally conductive plate via the through opening.

7. The environmental control unit of claim 1, wherein the air handling portion overlies the condensing portion.

8. The environmental control unit of claim 1, wherein the control board comprises a printed circuit board and a controller that is mounted on the printed circuit board.

9. The environmental control unit of claim 1, wherein one mode of the two independent modes of cooling includes conductive cooling via a cooling plate, the cooling plate comprising: a first cooling plate surface that faces the blower; a second cooling plate surface that is opposite the first cooling plate surface; and an internal passageway that defines the coolant line that is disposed between the first cooling plate surface and the second cooling plate surface, the coolant line being in fluid communication with the refrigerant line and extending in a serpentine path.

10. The environmental control unit of claim 1, wherein one mode of the two independent modes of cooling includes conductive cooling via a cooling plate, the cooling plate comprising: a first cooling plate surface that faces the blower; a second cooling plate surface that is opposite the first cooling plate surface; and an internal passageway that defines the coolant line that is disposed between the first cooling plate surface and the second cooling plate surface, the coolant line being in fluid communication with the refrigerant line, the internal passageway comprising a plurality of internal passages that are supplied by a manifold that is connected to the refrigerant line.

* * * * *